United States Patent
Weng et al.

(10) Patent No.: US 9,117,714 B2
(45) Date of Patent: Aug. 25, 2015

(54) WAFER LEVEL PACKAGE AND MASK FOR FABRICATING THE SAME

(75) Inventors: Fu-Tien Weng, Hsinchu (TW); Yung-Shun Liao, Yunlin (TW); Yi-Chuan Lo, Hsinchu (TW); Bii-Cheng Chang, Hsinchu (TW)

(73) Assignee: VisEra TECHNOLOGIES COMPANY LIMITED, Hsinchu Science Park (TW)

( * ) Notice: Subject to any disclaimer, the term of this patent is extended or adjusted under 35 U.S.C. 154(b) by 1258 days.

(21) Appl. No.: 11/976,058

(22) Filed: Oct. 19, 2007

(65) Prior Publication Data

US 2009/0102005 A1   Apr. 23, 2009

(51) Int. Cl.
*H01L 27/00* (2006.01)
*H01L 27/146* (2006.01)
*H01L 23/10* (2006.01)

(52) U.S. Cl.
CPC .......... *H01L 27/14618* (2013.01); *H01L 23/10* (2013.01); *H01L 27/14683* (2013.01); *H01L 2924/0002* (2013.01)

(58) Field of Classification Search
USPC .......................................... 257/787; 438/111
See application file for complete search history.

(56) References Cited

U.S. PATENT DOCUMENTS

| | | | |
|---|---|---|---|
| 6,596,561 B2 * | 7/2003 | Takahashi et al. | 438/113 |
| 6,784,020 B2 * | 8/2004 | Lee et al. | 438/106 |
| 6,936,494 B2 * | 8/2005 | Cheung | 438/55 |
| 7,264,995 B2 * | 9/2007 | Kim | 438/106 |
| 2005/0127535 A1 * | 6/2005 | Takahashi et al. | 257/787 |
| 2007/0080418 A1 | 4/2007 | Ryu | |
| 2007/0187711 A1 | 8/2007 | Hsiao et al. | |
| 2009/0026562 A1 * | 1/2009 | Wang et al. | 257/432 |

FOREIGN PATENT DOCUMENTS

| | | |
|---|---|---|
| CN | 1360344 A | 7/2002 |
| CN | 1606151 A | 4/2005 |

* cited by examiner

*Primary Examiner* — Nathan Ha
(74) *Attorney, Agent, or Firm* — Muncy, Geissler, Olds & Lowe, P.C.

(57) ABSTRACT

An exemplary wafer level package comprises a semiconductor wafer with a plurality of semiconductor chips of perfect polygonal shapes thereon. A circuit-free area is defined over the semiconductor wafer to electrically isolate the semiconductor chips. A dam structure is substantially formed over the circuit-free area, wherein a portion of the dam structure formed around an edge of the semiconductor wafer is formed with a plurality via holes therein. A transparent substrate is formed over the semiconductor wafer, defining a plurality of cavities between the semiconductor chips and the transparent substrate, wherein the transparent substrate is supported by the dam structure.

17 Claims, 7 Drawing Sheets

WAFER LEVEL PACKAGE AND MASK FOR FABRICATING THE SAME

BACKGROUND OF THE INVENTION

1. Field of the Invention

The invention relates to integrated circuit (IC) packages and more particularly to a wafer level chip scale package and a mask for fabricating the same.

2. Description of the Related Art

Solid state electronic devices, more colloquially known as semiconductor chips or dies, are typically manufactured from a semiconductor substrate material such as silicon, germanium or gallium/arsenide. Circuitry is formed on one surface of the device with input and output pads formed around the periphery or central position to facilitate electrical connection with a host electrical apparatus.

An essential step in the manufacturing of solid state electronic devices is the packaging step. Packaging involves mechanical and environmental protection of a semiconductor chip and provides electrical interconnection between predetermined locations on the semiconductor chip and external electrical terminals.

Existing packaging techniques for mounting a semiconductor die on a substrate via the bonding points on both the die and the substrate include ball grid array (BGA), wire bonding, and flip chip. The inner traces aid in fan out the bonding points on the bottom of the substrate. The solder balls are separately planted on the bonding points to serve as an interface for electrical connection of the die to the external circuitry.

Recently, wafer level chip scale package (WLCSP) technology, a new packaging technology, has received attention as a formidable three-dimensional mounting technology. The WLCSP provides a small package having about the same outside dimensions as a die packaged therein. Further, WLCSP is advantageous in enabling printing of the redistribution circuit directly on the die by using the peripheral area of the die as the bonding points. This is made possible by redistributing an area array on the surface of the die, allowing the entire area of the die to be fully utilized. The bonding points are located on the redistribution circuit by forming flip chip bumps, thus, the bottom side of the die connects directly to the printed circuit board (PCB) with micro-spaced bonding points.

BRIEF SUMMARY OF THE INVENTION

A wafer level package and mask for fabricating the same are provided.

An exemplary embodiment of a wafer level package comprises a semiconductor wafer with a plurality of semiconductor chips of perfect polygonal shapes thereon. A circuit-free area is defined over the semiconductor wafer to electrically isolate the semiconductor chips. A dam structure is substantially formed over the circuit-free area, wherein a portion of the dam structure formed around an edge of the semiconductor wafer is formed with a plurality via holes therein. A transparent substrate is formed over the semiconductor wafer, defining a plurality of cavities between the semiconductor chips and the transparent substrate, wherein the transparent substrate is supported by the dam structure.

Another exemplary embodiment of a wafer level package comprises a semiconductor wafer with a plurality of semiconductor chips of perfect polygonal shapes thereon. A circuit-free area is defined over the semiconductor wafer to electrically isolate the semiconductor chips. A dam structure is substantially formed over the circuit-free area. A transparent substrate is formed over the semiconductor wafer, defining a plurality of cavities between the semiconductor chips and the transparent substrate, wherein the transparent substrate is supported by the dam structure. A plurality of light-transmitting patterns are formed in a portion of the dam structure around an edge of the semiconductor wafer.

An exemplary embodiment of a mask for fabricating a wafer level package comprises a transparent and a plurality of first opaque patterns formed thereon, wherein the first opaque patterns are formed as an array and are separated from each other to thereby define device patterns.

A detailed description is given in the following embodiments with reference to the accompanying drawings.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1~6 are schematic diagrams showing fabrication of a wafer level package known by the inventors and does not illustrate a prior art wafer level packages.

Figure 1:
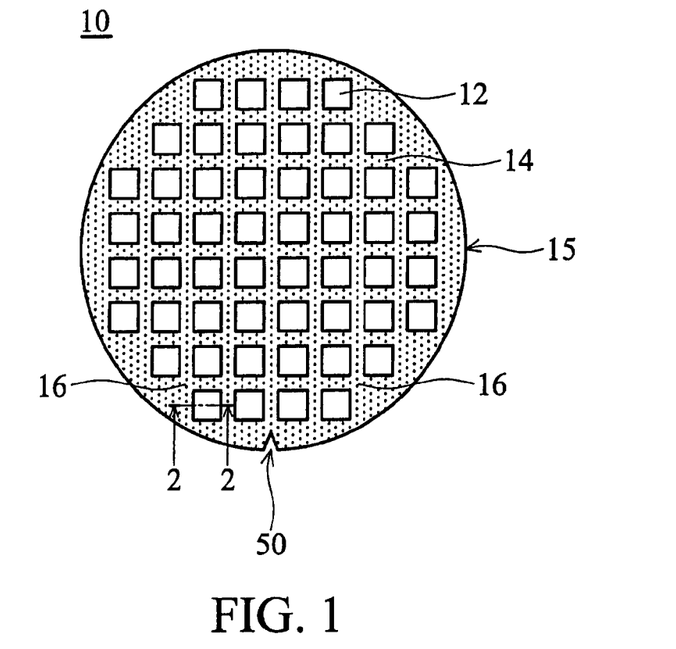
FIG. 1 is a schematic top view showing an unpackaged wafer according to an exemplary embodiment.

In FIG. 1, an unpackaged wafer 10 is provided, including a plurality of semiconductor chips 12 formed thereon. As shown in FIG. 1, the semiconductor chips 12 are active chips of perfect polygonal patterns such as perfect rectangular patterns and are capable of predetermined functions such as image sensing. During this step, there are no semiconductor chips 12 of non-prefect polygonal patterns defined over the unpackaged wafer 10 and the semiconductor chips 12 in FIG. 1 have not been separated or diced but remain in the form of a wafer 10 for additional wafer processing.

In the wafer 10 illustrated in FIG. 1, each of the semiconductor chips 12 is separated from adjacent semiconductor chips by generally circuit-free areas 14 therebetween. In addition, since there are no semiconductor chips 12 of non-perfect polygonal patterns formed over the unpackaged wafer, another circuit-free region 16 is provided around an edge 15 of the wafer 10 and the circuit-free region 16 thereby surrounding the semiconductor chips 12 from the wafer edge 18. The unpackaged wafer 10 can be, for example, an 8-inch wafer provided with a notch 50 for defining an orientation thereon, as illustrated in FIG. 1.

Figure 2:
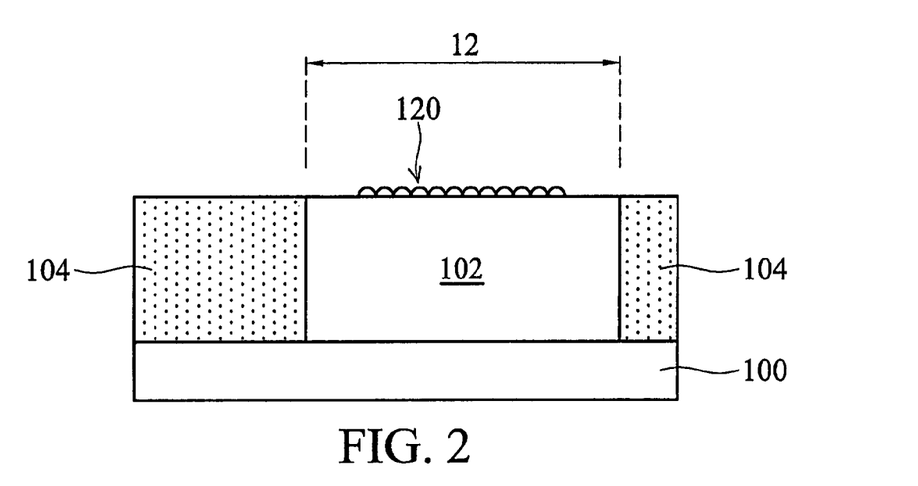
FIG. 2 is a schematic diagram showing a cross section taken along line 2-2 in FIG. 1.

FIG. 2 is a schematic diagram showing a cross section taken along line 2-2 in FIG. 1. As shown in FIG. 2, a semiconductor chip 12 is illustrated as, for example, a solid state image sensing device having a semiconductor substrate 100 provided with an image sensing structure 102 formed thereon. The image sensing structure 102 is illustrated as a planar structure in FIG. 2, for simplicity, and may include functional features such as color filters (not shown), photoelectric generating devices (not shown) such as CCD or CMOS devices, and other interconnecting circuitry (not shown) therein. A microlens array 120 is provided over a portion of a top surface of the image sensing structure 102. In FIG. 2, a circuit-free region 14 disposed between a pair of adjacent semiconductor chips 12 is defined at a right side of the image sensing structure 102 and a circuit-free region 16 disposed near the wafer edge is defined at a left side of the image sensing structure 102 by forming a circuit-free structure 104 having no conductive features therein. The circuit-free structure 104 can be, for example, a stacked structure of the dielectric layers (not shown) in the image sensing structure 102 and has no functional conductive features formed therein.

Figure 3:
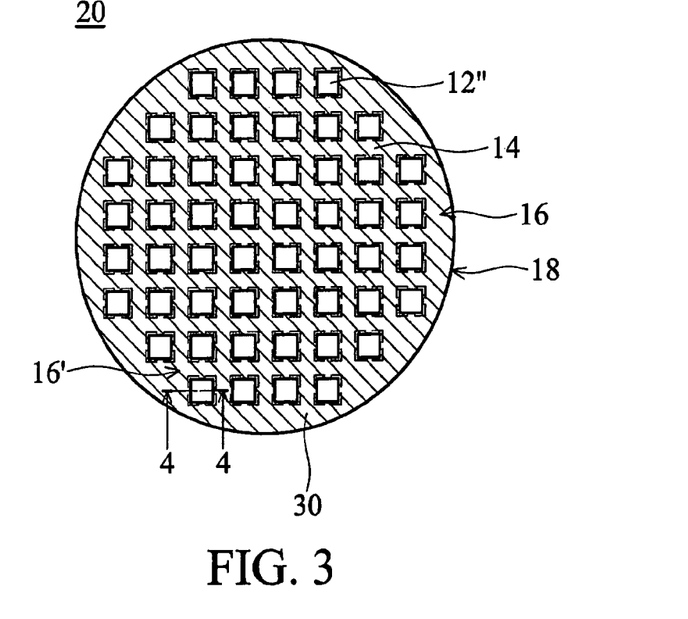
FIG. 3 is a schematic top view showing a wafer level package obtained from the unpackaged wafer in FIG. 1.

FIG. 3 is a schematic diagram showing packaged wafer 20 after another substrate, for example a transparent substrate 18 (see FIG. 4), is provided over the wafer 10 illustrated in FIG. 1. During this step, the transparent substrate 18 is formed with a shape similar with the underlying wafer 10 and a plurality of dam structures 30 are provided between the transparent substrate 19 and the semiconductor substrate 100 of the wafer 10 to thereby support the transparent substrate 18. The dam structure 30 is substantially provided over the circuit-free regions 14 and 16 and may be partially provided over the semiconductor chips 12 (see FIG. 4) thereby exposing a light-transmitting region 12' thereof. The dam structure 30 can be formed of, for example, conventional negative-type photo-sensitive materials and can be patterned by photolithography using a suitable mask.

Figure 4:
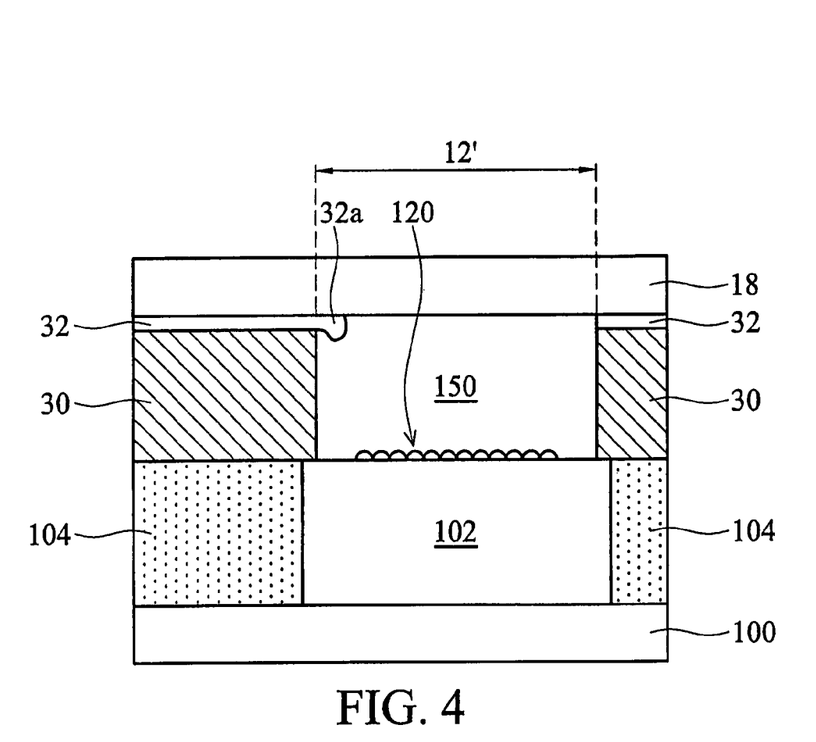
FIGS. 4 and 5 are schematic diagrams showing an exemplary cross section taken along line 4-4 in FIG. 3, respectively.
Figure 5:
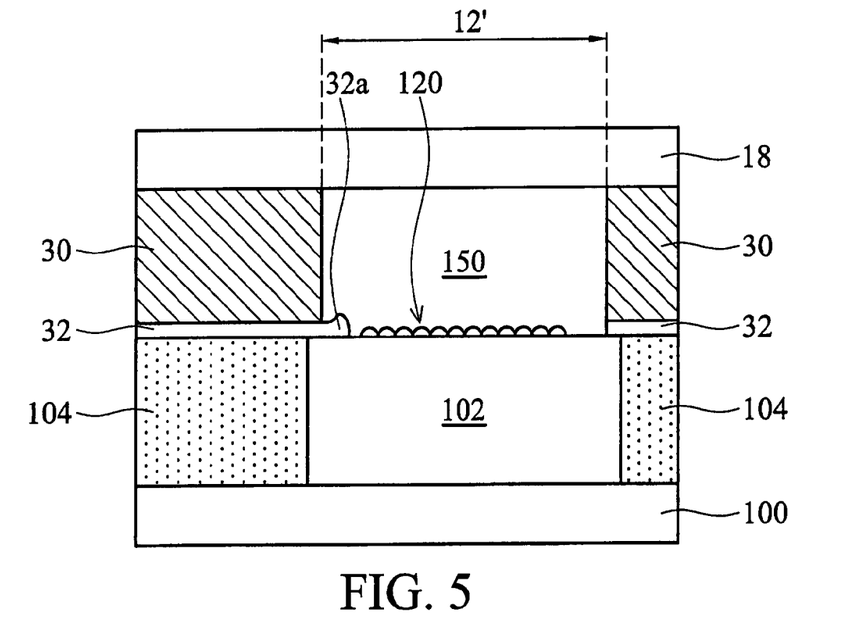

FIG. 4 is schematic diagram showing a cross section taken along line 4-4 in FIG. 3. As shown in FIG. 4, the transparent substrate 18 is provided over the semiconductor substrate 100 and is supported by the dam structure 30, thereby defining a cavity 150 between the semiconductor substrate 100 and the transparent substrate 18. An adhesion layer 32 is further provided between the dam structure 30 and the transparent substrate 18 to provide suitable adhesion therebetween. However, since the dam structure 30 formed in the circuit-free region 16 in the wafer edge occupies more areas than the circuit-free region 14 formed between the two adjacent semiconductor chips 12, undesired issues such as glue over filling can be thus found, as illustrated as the over-fill portion 32a in FIG. 4. FIG. 5 shows a modification of the packaged wafer illustrated in FIG. 4 and the adhesion layer 32 is now provided between a surface of the image sensing structure 102 and the dam structure 30.

Figure 6:
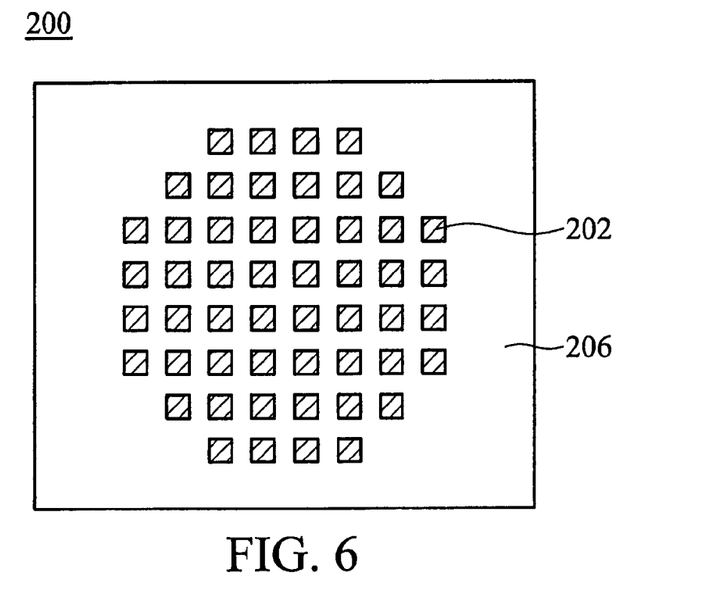
FIG. 6 is a schematic top view showing a layout of a mask used for fabrication of the wafer level package in FIG. 3.

FIG. 6 illustrates a schematic top view of a 1X mask 200 for patterning the dam structure 30 formed over either the semiconductor substrate 100 or the transparent substrate 18 of the wafer level packages 20 in FIG. 3. As shown in FIG. 6, the mask 200 is provided with a plurality of opaque regions 202 for defining the light-transmitting region 12' formed over the semiconductor chips 12 and a transparent region 206 surrounding thereof. During this step, patterns and arrangements of opaque regions 202 are the same as that of the semiconductor chips 12 and the opaque regions 202 are aligned to the semiconductor chips 12 one by one, having no additional dummy patterns on the mask 300. The mask 300 can be, for example, a binary mask and the opaque region 202 may comprise chromium (Cr) and the transparent region 206 may comprise light-transmitting materials such as glass.

The over-fill portion 32a of the adhesion layer 32 illustrated in FIGS. 4 and 5 may cause a decrease in a region of the light-transmitting region 12' overlying the device such as an image sensing device formed in or on the image sensing structure 102 and may over-fill a surface thereof, thereby hindering functionality of the semiconductor chips 12 and affecting device reliability thereof. In addition, since the dam structure 30 in the circuit-free region 16 at the wafer edge is formed in a greater volume than that in the circuit-free region 14 between a pair of adjacent semiconductor chips 12, stress differences exist and delamination of the dam structure 30 from either the transparent substrate 18 or the semiconductor substrate 100 is sometimes found during thermal cycling tests. Therefore, the inventors provide an improved wafer level package as follows to solve the above undesired issues found in the wafer level packaging.

FIGS. 7-10 are schematic diagrams showing an exemplary embodiment of an improved wafer level package 20' similar to that illustrated in FIG. 3 and only the differences therebetween are discussed as follows.

Figure 7:
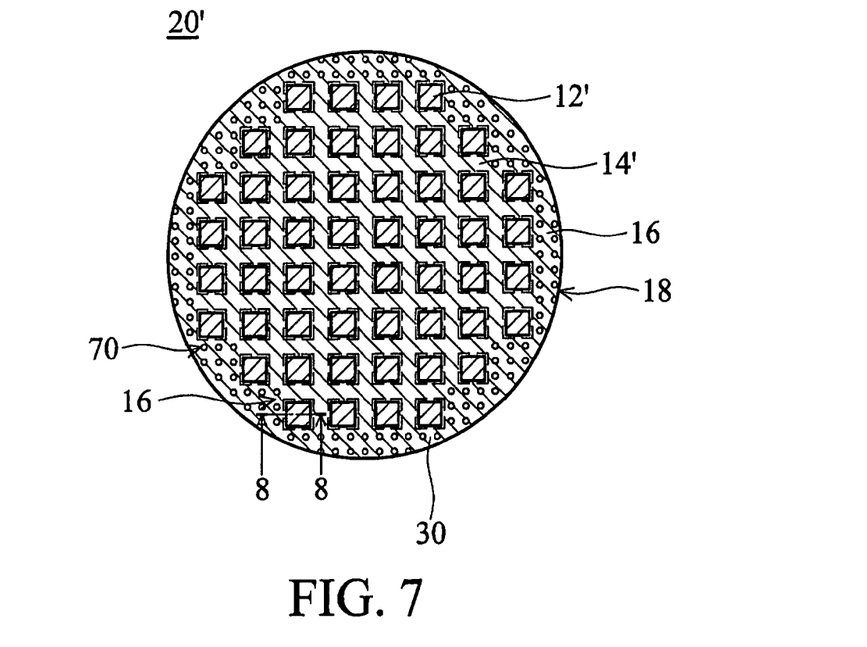
FIG. 7 is a schematic top view showing a wafer level package according to an exemplary embodiment.

In FIG. 7, a plurality of additional via holes 70 are further provided in the dam structure 30 located in the circuit-free region 16 around the wafer edge but not in the circuit-free region 14 between the semiconductor chips.

Figure 8:
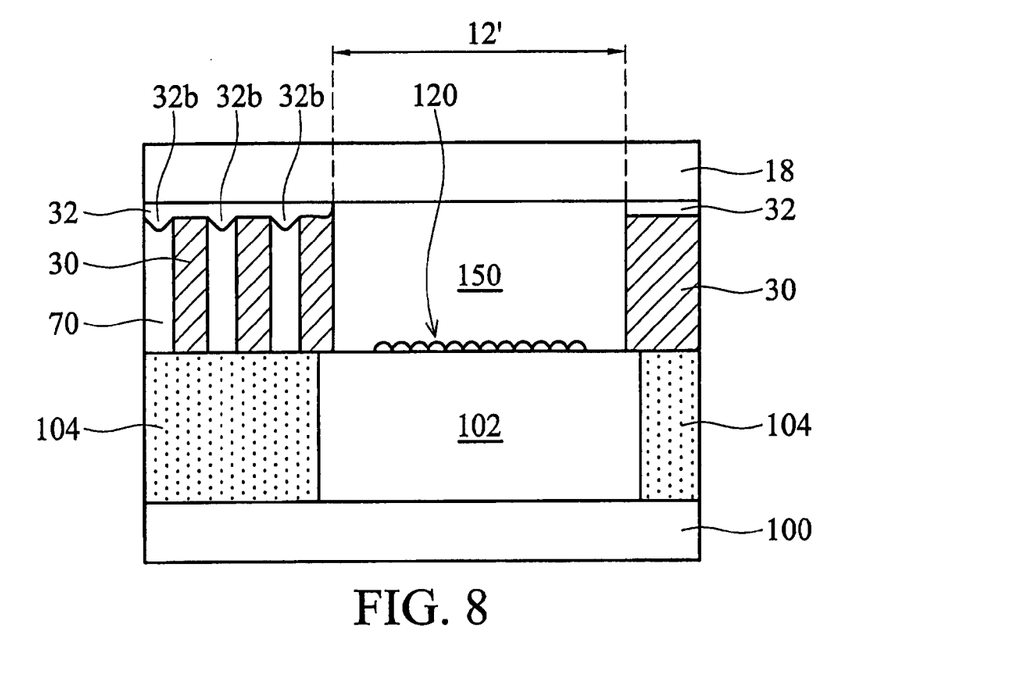
FIGS. 8 and 9 are schematic diagrams showing an exemplary cross section taken along line 8-8 in FIG. 7, respectively.
Figure 9:
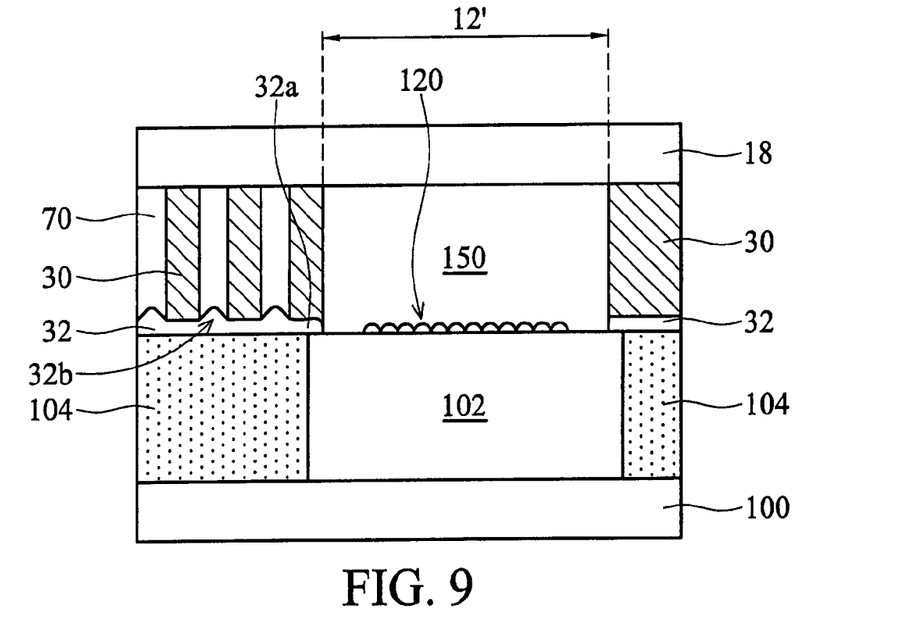

FIG. 8 is schematic diagram showing a cross section taken along line 8-8 in FIG. 7. As shown in FIG. 8, the transparent substrate 18 is provided over the semiconductor substrate 100 and is supported by the dam structure 30. The adhesion layer 32 is further provided between the dam structure 30 and the transparent substrate 20. During this step, since the dam structure 30 in the circuit-free region 16 is formed with isolated via hole 70 therein, excess portions 32b of the adhesion layer 32 may be applied into the top portion of the via holes 70, thereby preventing the above discussed glue-over filling issue. FIG. 9 shows a modification of the wafer-level package illustrated in FIG. 8 and the adhesion layer 32 is now provided between a surface of the internal layer 102 and the dam structure 30. Also, formation of the via holes 70 in the circuit-free region provide additional stress release effects and the delaminated layer issue can be thus be prevented. Thus, functionality of the semiconductor chip 12 and device reliability thereon can be ensured by forming the via holes 70 in the circuit-free region 16 formed around the wafer edge. Additionally, the structural differences between the dam structure 30 formed in the circuit-free regions 16 and 14 is thus decreased or prevented.

Figure 10:
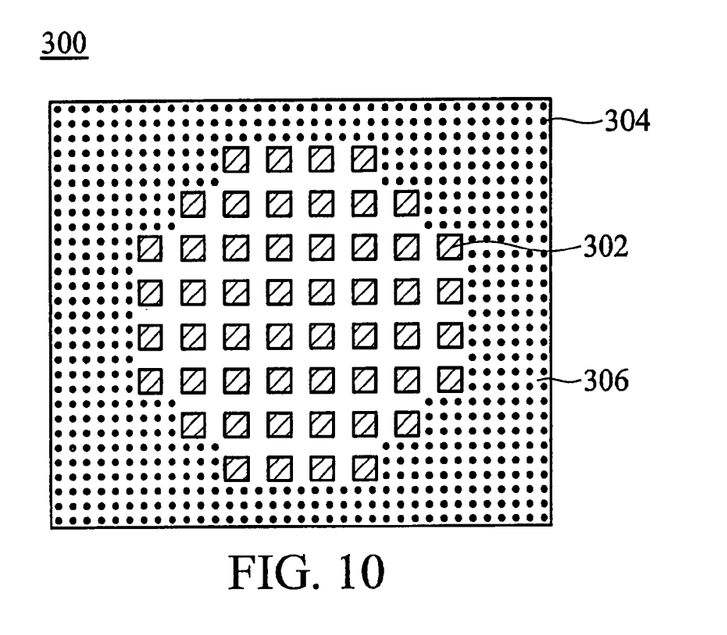
FIG. 10 is a schematic top view showing a layout of a mask used for fabrication of the wafer level package in FIG. 7.

FIG. 10 illustrates a schematic top view of a 1X mask 300 for fabricating the wafer level packages 20' illustrated in FIG. 7. As shown in FIG. 10, the mask 300 is provided with a plurality of first opaque region 302 for defining the light-transmitting region 12' formed over the semiconductor chips 12 and a plurality of second opaque region 304 for forming the via holes 70. Also provided is a plurality of second opaque regions 304. During this step, the opaque regions 304 surround the first opaque regions 304 around a periphery region thereof and have a shape different from each other. The mask 300 can be a binary mask similar to that of FIG. 3 and the first and second opaque regions 302 and 304 may comprise chromium and the transparent region 306 may comprise glass.

FIGS. 11-14 are schematic diagrams showing another exemplary embodiment of a wafer level package 20" similar to that illustrated in FIG. 7, with only the differences therebetween are discussed as follows.

Figure 11:
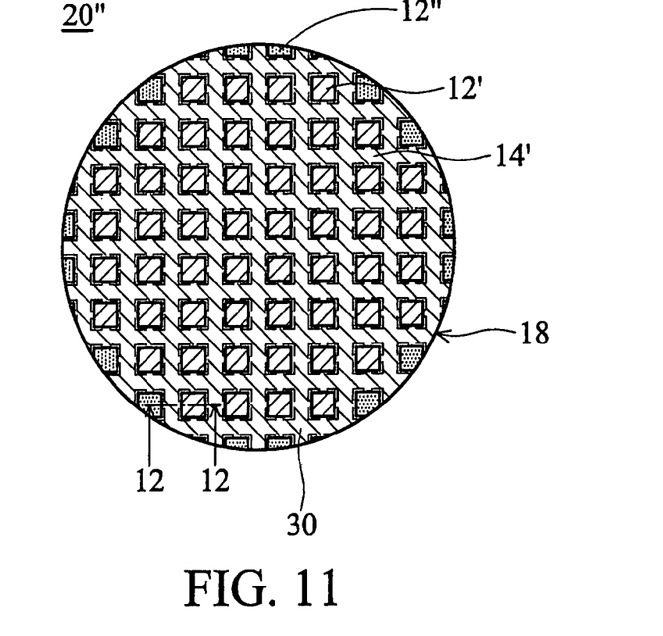
FIG. 11 is a schematic top view showing a wafer level package according to another exemplary embodiment.

As shown in FIG. 11, a plurality of additional light-transmitting regions 12" are formed in the dam structure 30 located in the circuit-free region 16 around the wafer edge but not in the circuit-free region 14 between the semiconductor chips. During this step, the light-transmitting region 12" are not formed in a perfect polygonal pattern like that of the light-transmitting region 12' formed over the semiconductor chips 12.

Figure 12:
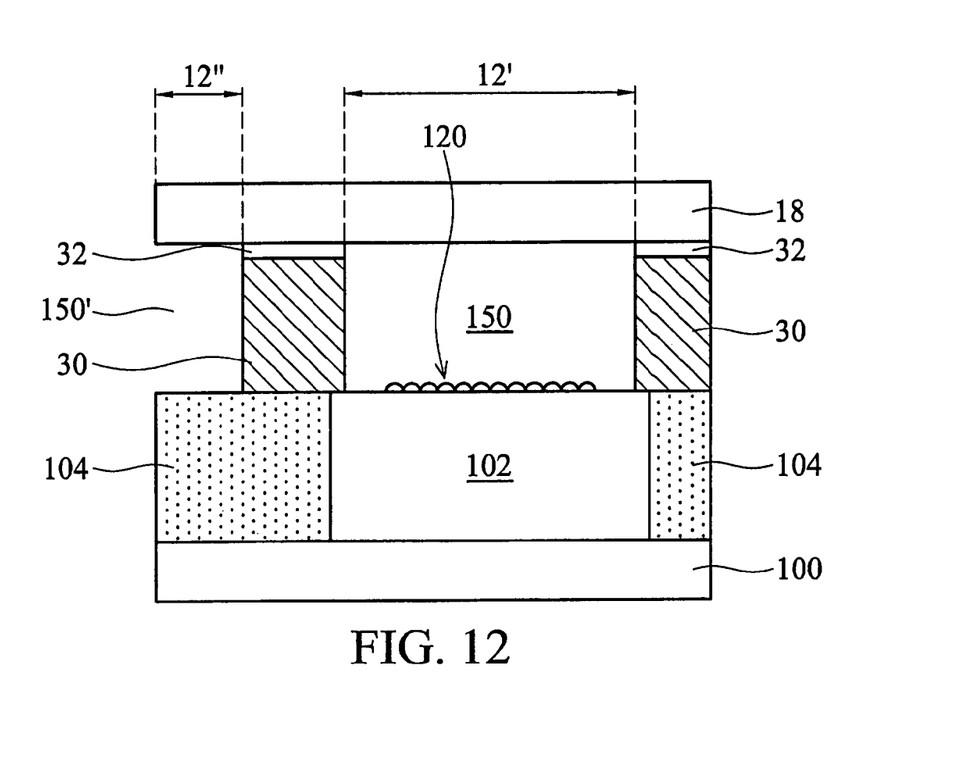
FIGS. 12 and 13 are schematic diagrams showing an exemplary cross section taken along line 12-12 in FIG. 11, respectively.
Figure 13:
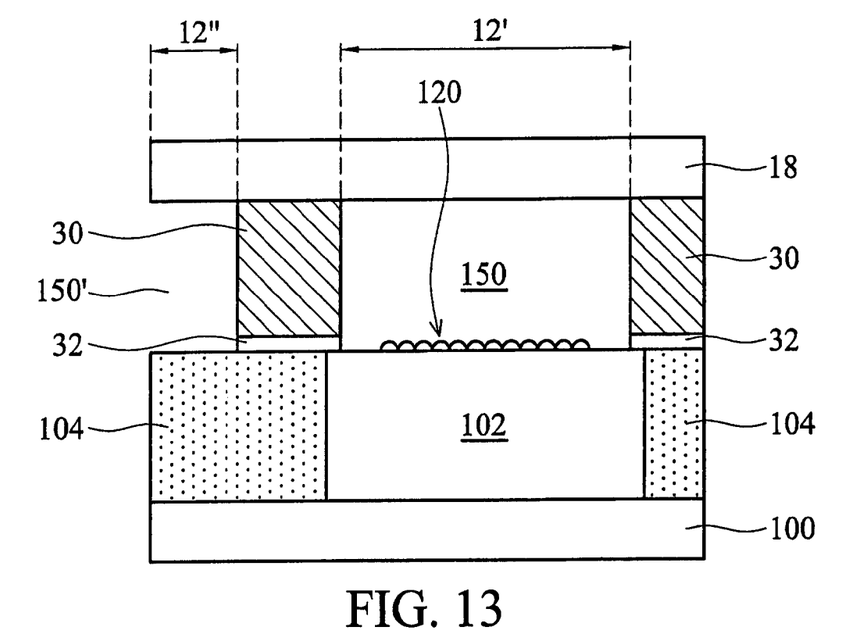

FIG. 12 is schematic diagram showing a cross section taken along line 12-12 in FIG. 11. As shown in FIG. 12, the transparent substrate 18 is now provided over the semiconductor substrate 100 and is supported by the dam structure 30. The adhesion layer 32 is further provided between the dam structure 30 and the transparent substrate 18. During this step, since the dam structure 30 in the circuit-free region 16 is partially removed to form the light-transmitting region 12" therein. Therefore, a cavity 150' is thus defined between the transparent substrate 18 and the semiconductor substrate 100 around the wafer edge. The dam structure 30 and the glue layer 32 around the wafer edge is now partially removed and has a volume similar with that formed between the two adjacent semiconductor chips 12, thereby preventing the aforementioned glue-over fill issue. FIG. 13 shows a modification of the wafer-level package from that in FIG. 12, with the adhesion layer 32 is now provided between a surface of the image sensing structure 102 and the dam structure 30. Also, partial removal of the dam structure 30 in the circuit-free region 106 around the wafer edge provides additional stress release effects and the delaminated layer issue can thus be prevented. Thus, functionality of the semiconductor chips 12 and device reliability thereon can be ensured by forming the light-transmitting region 12" in the circuit-free region 16 formed around the wafer edge. Additionally, the structural differences between the dam structure 30 formed in the circuit-free regions 16 and 14 is thus decreased or prevented.

Figure 14:
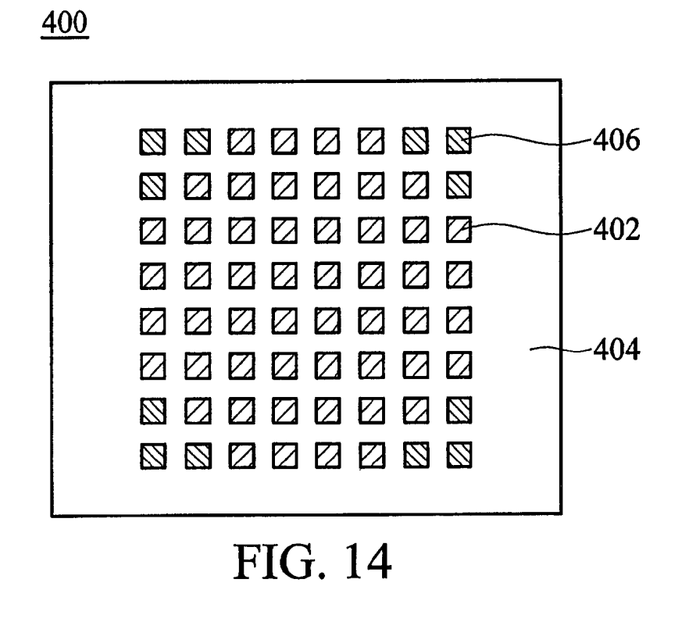
FIG. 14 is a schematic top view showing a layout of a mask used for fabrication of the wafer level package in FIG. 11.

FIG. 14 illustrates a schematic top view of a 1X mask 400 for fabricating the wafer level packages 20" illustrated in FIG. 11. As shown in FIG. 14, the mask 400 is provided with an array of a plurality of first opaque regions 402 for defining the light-transmitting region 12' formed over the semiconductor chips 12, an array of a plurality of second opaque region 406 for defining the light-transmitting region 12" in the circuit-free regions 16 around the wafer edge, and a plurality of transparent region 404 surrounding thereof. The mask 400 can be, for example, a binary mask and the first and second opaque regions 402 and 406 may comprise chromium and the transparent region 404 may comprise glass.

The wafer level packages 20, 20' and 20" can be further processed to sequentially form features such as bond pad or redistribution lines on each of the semiconductor chips 12 and then diced into a plurality of individual semiconductor packages with predetermined functionality. Bond pad formation and semiconductor chips dicing are known to those skilled in the art and are not described here in detail, for simplicity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wafer level package, comprising:
   a semiconductor wafer integrated with a plurality of semiconductor chips, wherein the semiconductor chips comprise an image sensing structure and a microlens array over the image sensing structure;
   a circuit-free area defined over the semiconductor wafer to electrically isolate the semiconductor chips;
   a dam structure substantially formed over the circuit-free area, wherein a portion of the dam structure formed around an edge of the semiconductor wafer is formed with a plurality via holes therein; and
   a transparent substrate formed over the semiconductor wafer, defining a plurality of cavities between the semiconductor chips and the transparent substrate, wherein the transparent substrate is supported by the dam structure.

2. The wafer level package as claimed in claim 1, further comprising an adhesion layer formed between the dam structure and the transparent substrate.

3. The wafer level package as claimed in claim 1, further comprising an adhesion layer formed between the dam structure and the semiconductor wafer.

4. The wafer level package as claimed in claim 2, wherein the via holes are arranged as an array and at least one of the via holes is partially filled with the adhesion layer from a top portion thereof.

5. The wafer level package as claimed in claim 2, wherein the via holes are arranged as an array and at least one of the via holes is partially filled with the adhesion layer from a bottom portion thereof.

6. The wafer level package as claimed in claim 1, wherein the dam structure comprises negative-type photoresist materials.

7. The wafer level package as claimed in claim 1, wherein the dam structure comprises negative-type photoresist materials.

8. A wafer level package, comprising:
   a semiconductor wafer integrated with a plurality of semiconductor chips, wherein the semiconductor chips comprise an image sensing structure and a microlens array over the image sensing structure;
   a circuit-free area defined over the semiconductor wafer to electrically isolate the semiconductor chips;
   a dam structure substantially formed over the circuit-free area;
   a transparent substrate formed over the semiconductor wafer, defining a plurality of cavities between the semiconductor chips and the transparent substrate, wherein the transparent substrate is supported by the dam structure; and
   a plurality of light-transmitting patterns formed in a portion of the dam structure around an edge of the semiconductor wafer.

9. The wafer level package as claimed in claim 8, further comprising an adhesion layer formed between the dam structure and the transparent substrate.

10. The wafer level package as claimed in claim 8, further comprising an adhesion layer formed between the dam structure and the semiconductor wafer.

11. The wafer level package as claimed in claim 9, wherein the circuit-free area adjacent to at least one of the light-transmitting patterns is partially filled with the adhesion layer from a top portion thereof.

12. The wafer level package as claimed in claim 9, the circuit-free area adjacent to at least one of the light-transmitting patterns is partially filled with the adhesion layer from a bottom portion thereof.

13. A mask for fabricating a wafer level package, capable of defining a dam structure over a substrate, comprising:
   a glass substrate; and
   a plurality of first opaque patterns formed over the glass substrate, wherein the first opaque patterns comprise chromium and are formed as an array and are separated from each other to thereby define device patterns.

14. The mask as claimed in claim 13, further comprising a plurality of second opaque patterns formed over the glass substrate around a periphery of the array of the first opaque patterns, wherein the second opaque patterns have a shape different from a shape of the first opaque patterns to define a dummy pattern.

15. The mask as claimed in claim 14, wherein the second opaque patterns comprises chromium.

16. The mask as claimed in claim 13, wherein the mask is a 1X mask.

17. The mask as claimed in claim 13, further comprising a plurality of second opaque patterns formed over the glass substrate around a periphery of the array of the first opaque patterns, wherein the second opaque patterns have a shape the same as that of the first opaque patterns to define a dummy pattern.

* * * * *